United States Patent
Kim et al.

(10) Patent No.: US 9,049,798 B2
(45) Date of Patent: Jun. 2, 2015

(54) MULTILAYERED CERAMIC ELECTRONIC COMPONENT AND BOARD FOR MOUNTING THE SAME

(71) Applicant: SAMSUNG ELECTRO-MECHANICS CO., LTD., Suwon, Gyunggi-do (KR)

(72) Inventors: Eung Soo Kim, Gyunggi-Do (KR); Dae Bok Oh, Gyunggi-Do (KR); Sang Huk Kim, Gyunggi-Do (KR); Jae Yeol Choi, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 118 days.

(21) Appl. No.: 13/950,657

(22) Filed: Jul. 25, 2013

(65) Prior Publication Data

US 2014/0318841 A1    Oct. 30, 2014

(30) Foreign Application Priority Data

Apr. 26, 2013    (KR) .......................... 10-2013-0046834

(51) Int. Cl.
*H05K 1/18*    (2006.01)
*H01G 4/30*    (2006.01)
(Continued)

(52) U.S. Cl.
CPC ................. *H05K 1/181* (2013.01); *H01G 4/30* (2013.01); *H01G 2/06* (2013.01); *H01G 4/385* (2013.01)

(58) Field of Classification Search
CPC .......... H01G 4/12; H01G 4/385; H05K 1/181
See application file for complete search history.

(56) References Cited

U.S. PATENT DOCUMENTS

2005/0088803 A1    4/2005    Umeda et al.
2012/0018205 A1    1/2012    Sato et al.
(Continued)

FOREIGN PATENT DOCUMENTS

| JP | 5-74644 A | 3/1993 |
| JP | 8-162357 A | 6/1996 |
| JP | 2003-264119 A | 9/2003 |

(Continued)

OTHER PUBLICATIONS

Japanese Office Action issued in Japanese Application No. 2013-150224 dated May 20, 2014, w/English translation.
Korean Office Action issued in Korean Application No. 10-2013-0046834 dated Jun. 12, 2014, w/English translation.

*Primary Examiner* — Jeremy C Norris
(74) *Attorney, Agent, or Firm* — McDermott Will & Emery LLP

(57) ABSTRACT

There is provided a multilayered ceramic electronic component including a ceramic body having a hexahedral shape, including a dielectric layer, satisfying T/W>1.0 when a length thereof is L, a width thereof is W, and a thickness thereof is T, and having first and second main surfaces, first and second end surfaces, and first and second side surfaces, a plurality of first and second internal electrodes, and first and second external electrodes electrically connected to the first and second internal electrodes, wherein the first and second external electrodes are electrically connected to the exposed portions of the first and second internal electrodes, include first and second head parts formed on the first and second end surfaces, and first and second band parts formed on the first and second main surfaces, and are not formed on the first and second side surfaces.

16 Claims, 10 Drawing Sheets

(51) Int. Cl.
*H01G 2/06* (2006.01)
*H01G 4/38* (2006.01)

(56) References Cited

U.S. PATENT DOCUMENTS

2012/0019099 A1    1/2012  Sato et al.
2013/0050897 A1    2/2013  Kim

FOREIGN PATENT DOCUMENTS

| | | |
|---|---|---|
| JP | 2005-129802 A | 5/2005 |
| JP | 2012-004480 A | 1/2012 |
| JP | 2012-28456 A | 2/2012 |
| JP | 2013-55320 A | 3/2013 |
| KR | 10-2012-0010148 A | 2/2012 |
| WO | 2012/132726 A1 | 10/2012 |

MULTILAYERED CERAMIC ELECTRONIC COMPONENT AND BOARD FOR MOUNTING THE SAME

CROSS-REFERENCE TO RELATED APPLICATION

This application claims the priority of Korean Patent Application No. 10-2013-0046834 filed on Apr. 26, 2013, in the Korean Intellectual Property Office, the disclosure of which is incorporated herein by reference.

BACKGROUND OF THE INVENTION

1. Field of the Invention

The present invention relates to a multilayered ceramic electronic component and a board for mounting the same.

2. Description of the Related Art

In accordance with the recent trend toward miniaturization of electronic products, the demand for a multilayer ceramic electronic component having a small size and high capacitance has increased.

Therefore, a dielectric layer and an internal electrode have been thinned and multilayered through various methods. Recently, as a thickness of the dielectric layer has been thinned, the multilayer ceramic electronic components in which the number of stacked layers is increased have been manufactured.

As the multilayered ceramic electronic component has been miniaturized and the thicknesses of the dielectric layer and the internal electrode have been reduced, the number of stacked layers has been increased to allow for the implementation of high capacitance.

As described above, the multilayered ceramic electronic component is miniaturized and the number of stacked layers is increased, such that the multilayered ceramic electronic component has a thickness greater than a width, thereby implementing high capacitance. However, a defect in which a chip topples over when the multilayered ceramic electronic component is mounted on a board may be frequently generated.

Therefore, research into a technology of enhancing device reliability by preventing the occurrence of defect in which the multilayered ceramic electronic component topples over and the chipping defect at the time of being mounted on the board while implementing the high capacitance is required.

RELATED ART DOCUMENT

Japanese Patent Laid-Open Publication No. JP 2005-129802

SUMMARY OF THE INVENTION

An aspect of the present invention provides a multilayered ceramic electronic component and a board for mounting the same.

According to an aspect of the present invention, there is provided a multilayered ceramic electronic component including: a ceramic body having a hexahedral shape, including a dielectric layer, satisfying T/W>1.0 when a length thereof is L, a width thereof is W, and a thickness thereof is T, and having first and second main surfaces opposing each other in a thickness direction, first and second end surfaces opposing each other in a length direction, and first and second side surfaces opposing each other in a width direction; a plurality of first and second internal electrodes disposed in the ceramic body so as to be alternately exposed through the first and second end surfaces, having the dielectric therebetween; and first and second external electrodes electrically connected to the first and second internal electrodes, respectively, wherein the first and second external electrodes are electrically connected to the exposed portions of the first and second internal electrodes, respectively, include first and second head parts formed on the first and second end surfaces, respectively, and first and second band parts formed on the first and second main surfaces, respectively, and are not formed on the first and second side surfaces.

L/W>1.0 may be satisfied.

The first and second internal electrodes may be stacked in the thickness direction of the ceramic body.

The first and second internal electrodes may be stacked in the width direction of the ceramic body.

When an average thickness of the dielectric layer is td, $0.1\ \mu m \leq td \leq 0.6\ \mu m$ may be satisfied.

A thickness of each of the first and second internal electrodes may be 0.6 μm or less.

The number of stacked dielectric layers may be 500 and more.

According to an aspect of the present invention, there is provided a multilayered ceramic electronic component including: a ceramic body having a hexahedral shape, including a dielectric layer, satisfying T/W>1.0 when a length thereof is L, a width thereof is W, and a thickness thereof is T, and having first and second end surfaces opposing each other in a length direction and first and second side surfaces opposing each other in a width direction; a plurality of first and second internal electrodes disposed in the ceramic body to be alternately exposed through the first and second end surfaces, having the dielectric therebetween; first and second external electrodes electrically connected to the first and second internal electrodes, respectively; and insulation layers formed on the first and second side surfaces, wherein the insulation layers cover regions of the first and second external electrodes formed on the first and second side surfaces.

L/W>1.0 may be satisfied.

The first and second internal electrodes may be stacked in a thickness direction of the ceramic body.

The first and second internal electrodes may be stacked in the width direction of the ceramic body.

When an average thickness of the dielectric layer is td, $0.1\ \mu m \leq td \leq 0.6\ \mu m$ may be satisfied.

A thickness of each of the first and second internal electrodes may be 0.6 μm or less.

The number of stacked dielectric layers may be 500 and more.

According to an aspect of the present invention, there is provided a board for mounting a multilayered ceramic electronic component, the board including: a printed circuit board having first and second electrode pads disposed thereon; and a multilayered ceramic electronic component installed on the printed circuit board, wherein the multilayered ceramic electronic component includes: a ceramic body having a hexahedral shape, including a dielectric layer, satisfying T/W>1.0 when a width thereof is W, and a thickness thereof is T, and having first and second main surfaces opposing each other in a thickness direction, first and second end surfaces opposing each other in a length direction, and first and second side surfaces opposing each other in a width direction; a plurality of first and second internal electrodes disposed in the ceramic body to be alternately exposed through the first and second end surfaces, having the dielectric layer therebetween; and first and second external electrodes electrically connected to the first and second internal electrodes, respectively, and wherein the first and second external electrodes are electrically connected to the exposed portions of the first and second internal electrodes, respectively, include first and second head parts formed on the first and second end surfaces, respectively, and first and second band parts formed on the first and second main surfaces, respectively, and are not formed on the first and second side surfaces.

According to an aspect of the present invention, there is provided a board for mounting a multilayered ceramic electronic component, the board including: a printed circuit board having first and second electrode pads disposed thereon; and a multilayered ceramic electronic component installed on the printed circuit board, wherein the multilayered ceramic electronic component includes: a ceramic body having a hexahedral shape, including a dielectric layer, satisfying T/W>1.0 when a width thereof is W, and a thickness thereof is T, and having first and second end surfaces opposing each other in a length direction, and first and second side surfaces opposing each other in a width direction; a plurality of first and second internal electrodes disposed in the ceramic body to be alternately exposed through the first and second end surfaces, having the dielectric therebetween; first and second external electrodes electrically connected to the first and second internal electrodes, respectively; and insulation layers formed on the first and second side surfaces, and the insulation layers cover regions of the first and second external electrodes formed on the first and second side surfaces.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

Hereinafter, the multilayered ceramic electronic component according to the embodiment of the present invention will be described. Particularly, a multilayered ceramic capacitor will be described. However, the present invention is not limited thereto.

Multilayered Ceramic Capacitor

Hereinafter, embodiments of the present invention will now be described in detail with reference to the accompanying drawings.

Figure 1:
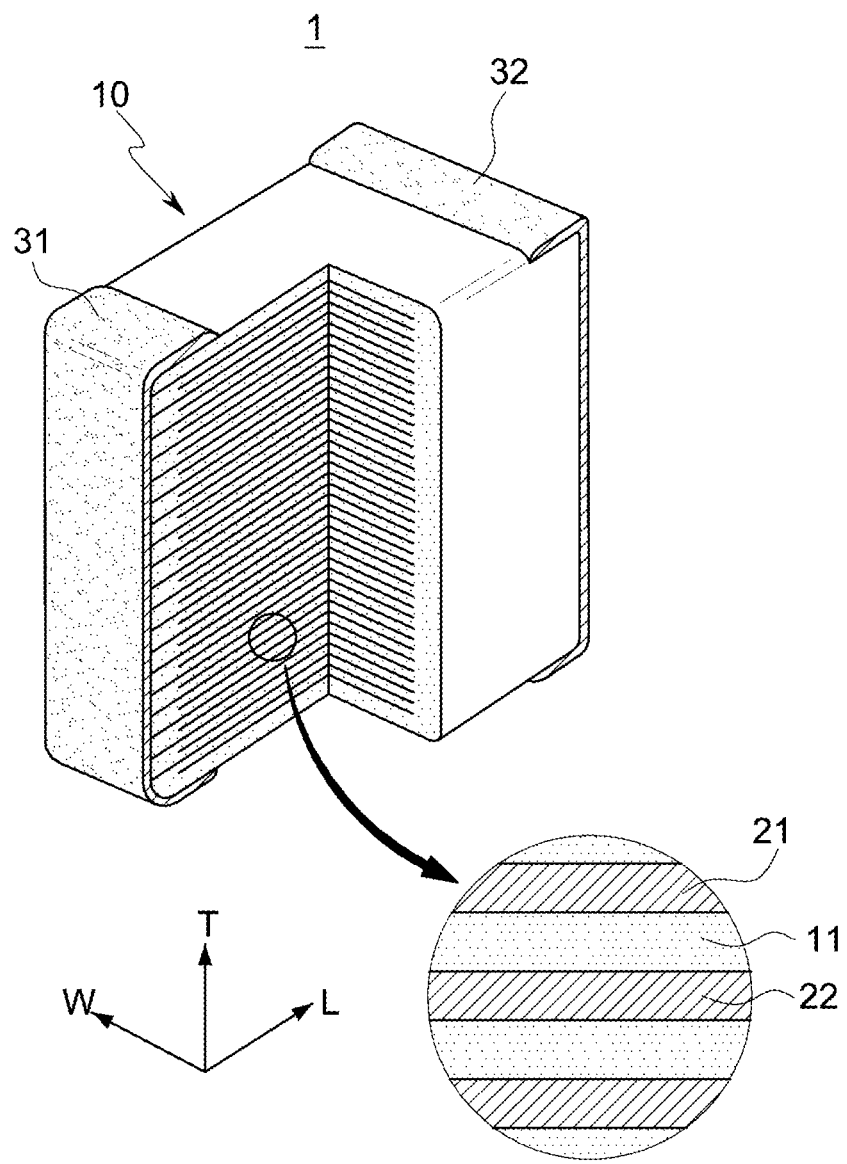
FIG. 1 is a partially cut-away perspective view schematically showing a multilayered ceramic electronic component according to a first embodiment of the present invention.

FIG. 1 is a partially cut-away perspective view schematically showing a multilayered ceramic capacitor according to a first embodiment of the present invention.

Figure 2:
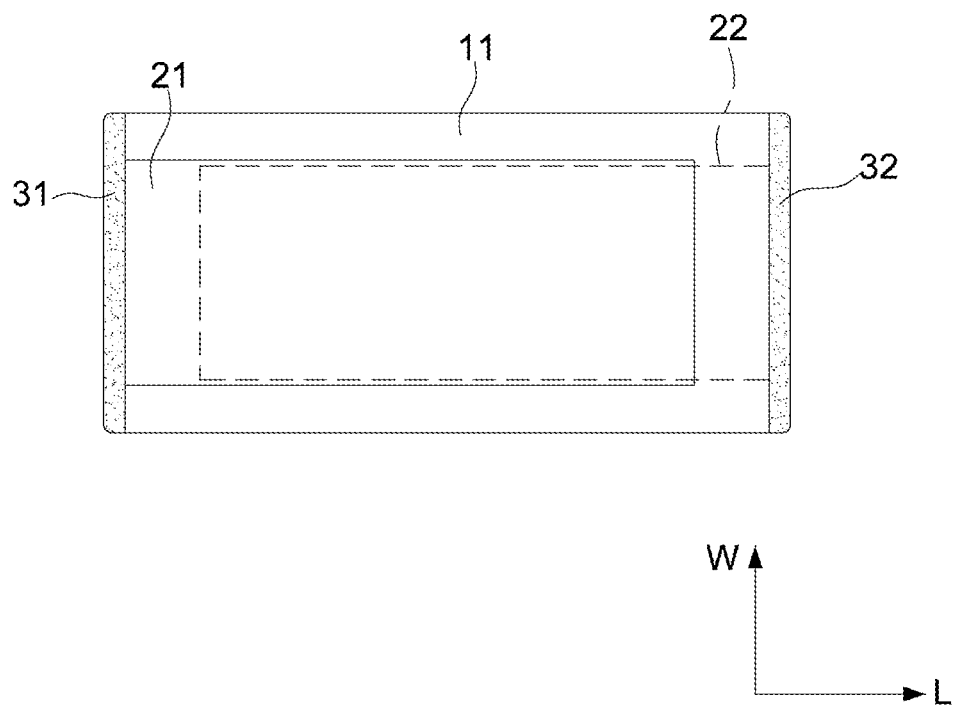
FIG. 2 is a cross-sectional view showing an L-W cross section of the multilayered ceramic electronic component of FIG. 1.

FIG. 2 is an L-W cross-sectional view illustrating the multilayered ceramic capacitor of FIG. 1 cut in a thickness direction.

Referring to FIGS. 1 and 2, the multilayered ceramic electronic component according to the first embodiment of the present invention may include: a ceramic body 10 having a hexahedral shape, including a dielectric layer 11, satisfying T/W>1.0 when a length thereof is L, a width thereof is W, and a thickness thereof is T, and having first and second main surfaces opposing each other in a thickness direction, first and second end surfaces opposing each other in a length direction, and first and second side surfaces opposing each other in a width direction; a plurality of first and second internal electrodes 21 and 22 disposed in the ceramic body to be alternately exposed through the first and second end surfaces, having the dielectric layer therebetween; and first and second external electrodes 31 and 32 electrically connected to the first and second internal electrodes, respectively.

The ceramic body 10 is not particularly limited, and for example, may have a hexahedral shape.

Meanwhile, in the multilayered ceramic capacitor according to the embodiment (the first embodiment) of the present invention, a 'length direction' refers to an 'L' direction, a 'width direction' refers to a 'W' direction, and a 'thickness direction' refers to a 'T' direction of FIG. 1. Here, the 'thickness direction' is the same as a direction in which the dielectric layers are stacked, that is, a 'stacking direction'.

According to the embodiment of the present invention, the ceramic body 10 may have first and second side surfaces opposing each other in a width direction, first and second end surfaces opposing each other in a length direction, and first and second main surfaces opposing each other in a thickness direction.

The multilayered ceramic capacitor 1 according to the embodiment of the present invention may include: a ceramic body 10 having a hexahedral shape, including a dielectric layer 11, and satisfying T/W>1.0 when a length thereof is L, a width thereof is W, and a thickness thereof is T; and first and second internal electrodes 21 and 22 stacked in the ceramic body 10 so as to face each other, having the dielectric layer 11 therebetween.

A material for forming the first and second internal electrodes 21 and 22 is not particularly limited. For example, the first and second internal electrodes 21 and 22 may be formed by using a noble metal material such as palladium (Pd), a palladium-silver (Pd—Ag) alloy, or the like, and a conductive paste formed of at least one of nickel (Ni) and copper (Cu).

The dielectric layer 11 may include a ceramic material having high dielectric constant, for example, a barium titanate ($BaTiO_3$) based powder, or a strontium titanate ($SrTiO_3$) based powder. However, the present invention is not limited thereto.

Meanwhile, the first and second internal electrodes 21 and 22, a pair of electrodes having different polarities, may be formed by printing a conductive paste including a conductive metal on the dielectric layer 11 at a predetermined thickness.

The average thickness of each of the first and second internal electrodes 21 and 22 after the sintering process is not particularly limited as long as the internal electrode may have capacitance. For example, the average thickness of each of the first and second internal electrodes may be 0.6 μm or less.

The average thickness of each of the internal electrodes 21 and 22 may be measured by scanning a cross-section of the ceramic body 10 in a width direction as an image using scanning electron microscope (SEM).

For example, the average thickness of the internal electrode may be calculated by measuring thicknesses of the internal electrode at thirty equidistant points in a width direction in an image obtained by scanning a cross section taken at the central portion of the ceramic body 10 in a width-thickness (W-T) direction cut in a length direction L using the scanning electron microscope (SEM).

The thirty equidistant points in a width direction may be measured in a capacitance forming part, wherein the capacitance forming part refers to a region in which the first and second internal electrodes 21 and 22 are overlapped with each other.

In addition, in the case in which the average value measurement is applied to at least 10 internal electrodes to measure the average values of at least 10 internal electrodes, the average thickness of the internal electrode may be significantly generalized.

Further, the first and second internal electrodes 21 and 22 may be formed so as to be alternately exposed through both end surfaces, in a stacking direction of the dielectric layer 11, and may be electrically insulated from each other by the dielectric layer 11 disposed therebetween.

That is, the first and second internal electrodes 21 and 22 may be electrically connected to the first and second external electrodes 31 and 32, respectively, through portions thereof alternately exposed through both end surfaces of the ceramic body 10.

Therefore, in the case in which voltage is applied to the first and second external electrodes 31 and 32, electric charges are accumulated between the first and second internal electrodes 21 and 22 facing each other. Here, capacitance of the multilayered ceramic capacitor 1 is in proportion to an area of a region in which the first and second internal electrodes 21 and 22 are overlapped with each other.

In order to form the capacitance, the first and second external electrodes 31 and 32 may be formed on outer surfaces of the ceramic body 10, and may be electrically connected to the first and second internal electrodes 21 and 22.

The first and second external electrodes 31 and 32 may be formed of the same conductive materials as that of the internal electrode, but are not limited thereto. For example, the external electrodes 31 and 32 may be formed of copper (Cu), silver (Ag), nickel (Ni), or the like.

The first and second external electrodes 31 and 32 may be formed by applying a conductive paste prepared by adding glass frit to the metal powder and performing a sintering process.

The ceramic body 10 may be formed by stacking a plurality of dielectric layers 11 and performing a sintering process, wherein a shape and a dimension of the ceramic body 10, and the number of stacked dielectric layers 11 are described in the embodiment of the present invention, but the present invention is not limited thereto.

In addition, the plurality of dielectric layers 11 forming the ceramic body 10 may be in a sintered state. Dielectric layers 11 adjacent to each other may be integrated so as to be difficult to confirm a boundary therebetween without using the scanning electron microscope (SEM).

According to the embodiment of the present invention, an average thickness td of the dielectric layer 11 may be arbitrarily changed according to a capacitance design of the multilayered ceramic capacitor 1, but may be 0.1 to 0.6 μm after performing the sintering process.

The average thickness td of the dielectric layer 11 may be measured by scanning the cross-section of the ceramic body 10 in a width direction as an image using the SEM.

For example, the average thickness of a dielectric layer may be calculated by measuring thicknesses of the dielectric layer at thirty equidistant points in a width direction in an image obtained by scanning a cross section taken at the central portion of the ceramic body 10 in a width-thickness (W-T) direction cut in a length direction L using the scanning electron microscope (SEM).

The thirty equidistant points in a width direction may be measured in a capacitance forming part, wherein the capacitance forming part refers to a region in which the first and second internal electrodes 21 and 22 are overlapped with each other.

In addition, in the case in which the average value measurement is applied to at least 10 dielectric layers to measure the average values of at least 10 dielectric layers, the average thickness of the dielectric layer may be significantly generalized.

The number of stacked dielectric layers 11 is not particularly limited, but for example, may be 500 layers or more.

As described above, the number of stacked dielectric layers 11 is 500 or more, such that the multilayered ceramic capacitor having high capacitance and having a thickness T of the ceramic body greater than a width W thereof may be implemented.

Meanwhile, when a length of the ceramic body 10 is L, a width thereof is W, and a thickness thereof is T, T/W>1.0 may be satisfied.

In the multilayered ceramic capacitor 1 according to the embodiment of the present invention, the number of stacked dielectric layers may be increased to allow for the implementation of high capacitance, such that the ceramic body 10 may have a thickness T thereof greater than a width W thereof.

A general multilayered ceramic capacitor has been manufactured so that a width and a thickness thereof have the approximately same size as each other.

However, since the multilayered ceramic capacitor according to the embodiment of the present invention may be miniaturized, a sufficient space for being mounted on the board may be secured, such that the number of stacked layers may be increased in order to allow for the implementation of the multilayered ceramic capacitor having high capacitance.

The number of stacked layers is increased as described above, and a stacking direction in the ceramic body is a thickness direction, such that a relationship between a thickness T and a width W of the ceramic body may satisfy T/W>1.0.

The multilayered ceramic capacitor is manufactured so that the relationship between the thickness T and the width W of the ceramic body satisfies T/W>1.0, such that the multilayered ceramic capacitor may topple over at the time of being mounted on the board to cause a short-circuit, that is, there may be problems in reliability.

In particular, the multilayered ceramic capacitor may be manufactured so that the relationship between the length L and the width W of the ceramic body satisfies L/W>1.0.

In the case in which the multilayered ceramic capacitor is manufactured so that the ceramic body satisfies T/W>1.0 and L/W>1.0 as described in the embodiment of the present invention, a case in which the multilayered ceramic capacitor topples over in a width direction at the time of being mounted on the board may be frequently generated as compared to a case in which the multilayered ceramic capacitor topples over in a length direction.

Therefore, the multilayered ceramic capacitor is manufactured so that the external electrode is not formed on the first and second side surfaces of the ceramic body opposing each other in the width direction, such that even when the multilayered ceramic capacitor topples over at the time of being mounted on the board, the short-circuit caused by the contact between the external electrodes may be prevented.

That is, according to the embodiment of the present invention, the first and second external electrodes may include first and second head parts formed on the first and second end surfaces opposing each other, respectively, and first and second band parts formed by extending the first and second head parts to the first and second main surfaces, wherein the external electrodes may not be formed on the first and second side surfaces.

The external electrode having the above-described shape may be obtained by performing a screen printing method on the ceramic body using a paste for external electrode, and may be obtained by removing the external electrode formed on the side surface in the case in which the ceramic body is dipped in the paste for external electrode.

Therefore, since the external electrode is not formed on the side surface of the ceramic body, even when the multilayered ceramic body topples over at the time of being mounted on the board, the short-circuit may not be generated, such that the multilayered ceramic capacitor may have excellent reliability, and the multilayered ceramic capacitors may be mounted to have the interval therebetween shorter than that of the multilayered ceramic capacitor according to the related art, thereby improving a mounting density.

Figure 3:
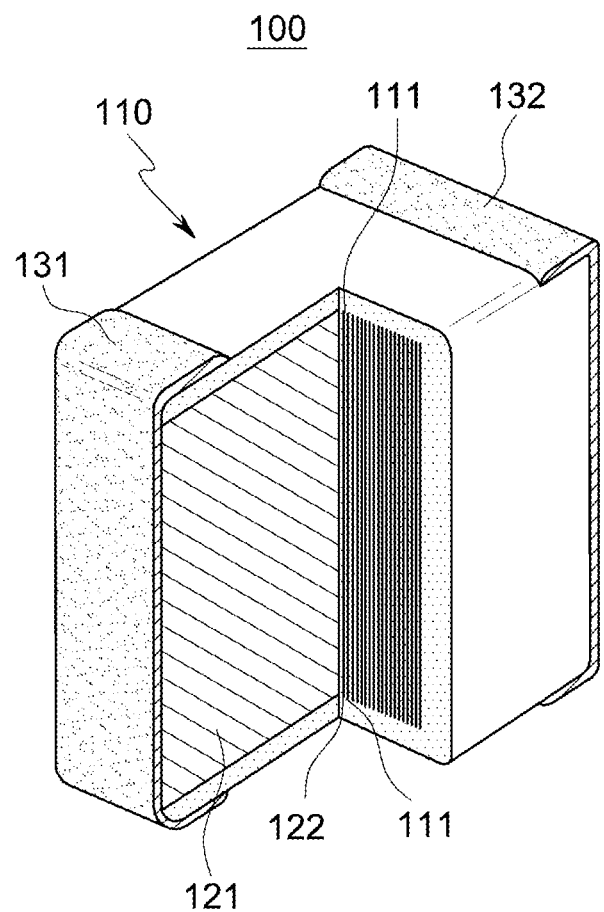
FIG. 3 is a partially cut-away perspective view schematically showing a multilayered ceramic electronic component according to a secondary embodiment of the present invention.
Figure 3:
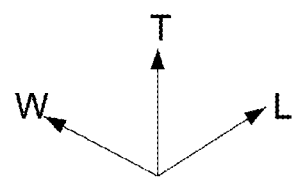

FIG. 3 is a partially cut-away perspective view schematically showing a multilayered ceramic capacitor according to a secondary embodiment of the present invention.

Figure 4:
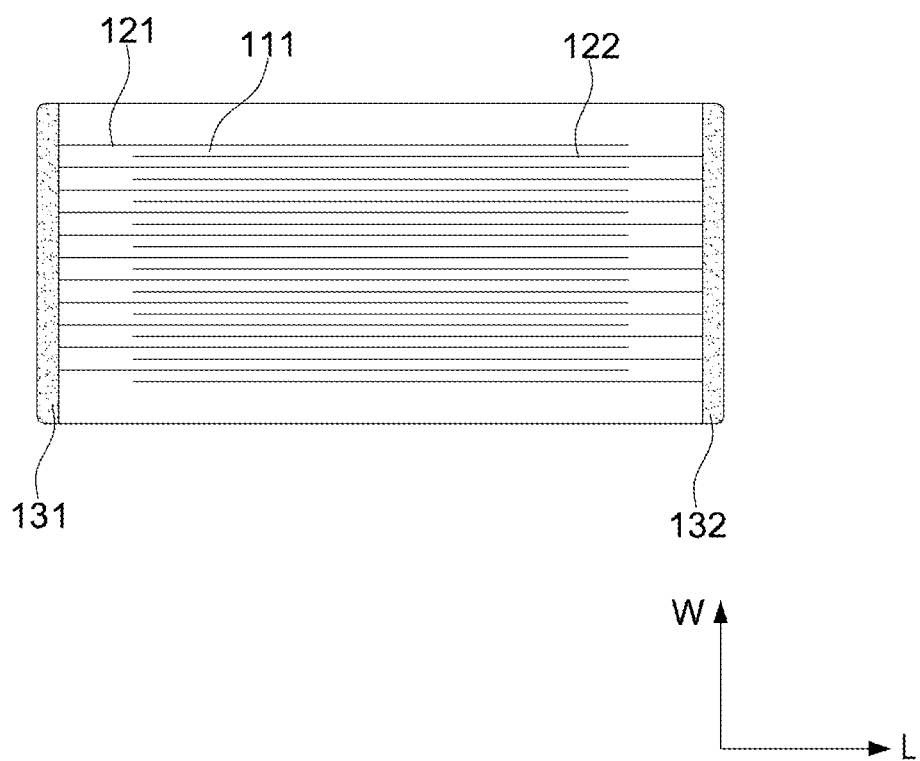
FIG. 4 is a cross-sectional view showing an L-W cross section of the multilayered ceramic electronic component of FIG. 3.

FIG. 4 is an L-W cross-sectional view shown illustrating the multilayered ceramic capacitor of FIG. 3 cut in a thickness direction.

Referring to FIGS. 3 and 4, in the multilayered ceramic capacitor 100 according to the secondary embodiment of the present invention, a 'length direction' refers to an 'L' direction of FIG. 3, a 'width direction' refers to a 'W' direction thereof, and a 'thickness direction' refers to a 'T' direction thereof. Here, the 'width direction' may be the same as a direction in which dielectric layers are stacked, that is, a 'stacking direction'.

That is, as shown in FIGS. 3 and 4, in the multilayered ceramic capacitor 100 according to the secondary embodiment of the present invention, the direction in which the dielectric layers are stacked may be the width direction of the ceramic body 110, unlike the above-described multilayered ceramic capacitor according to the first embodiment of the present invention.

When the multilayered ceramic capacitor 100 according to the secondary embodiment of the present invention is mounted on the board to be described below, the multilayered ceramic capacitor 100 may be vertically mounted, such that the internal electrode may be disposed to be perpendicular with respect to the board.

Since other characteristics of the multilayered ceramic capacitor according to the secondary embodiment of the present invention are the same as those of the multilayered ceramic capacitor according to the first embodiment of the present invention, a description of repeated portions will be omitted.

Figure 5:
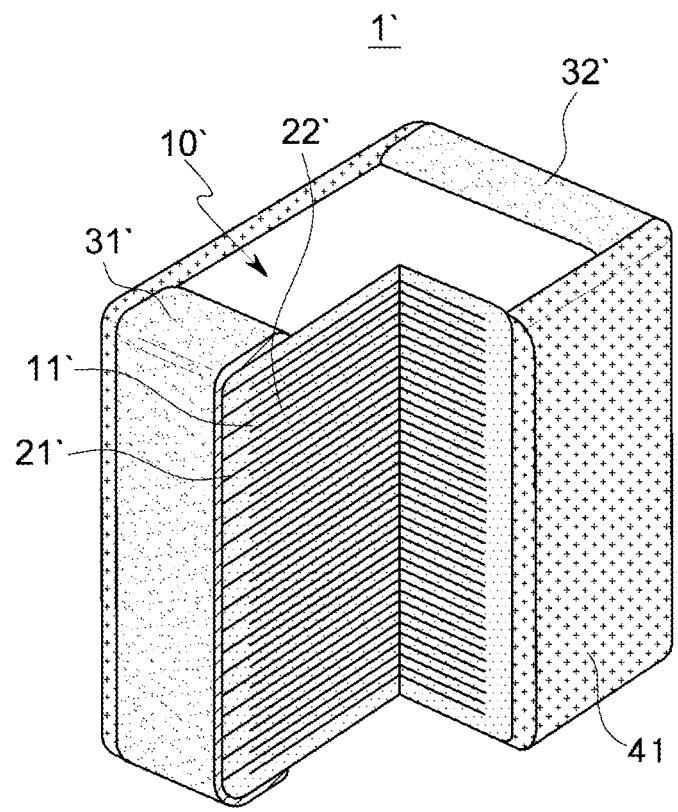
FIG. 5 is a partially cut-away perspective view schematically showing a multilayered ceramic electronic component according to a third embodiment of the present invention.
Figure 5:
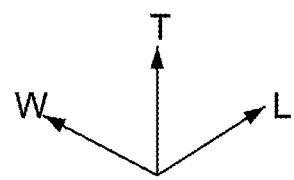

FIG. 5 is a partially cut-away perspective view schematically showing a multilayered ceramic electronic component according to a third embodiment of the present invention.

Figure 6:
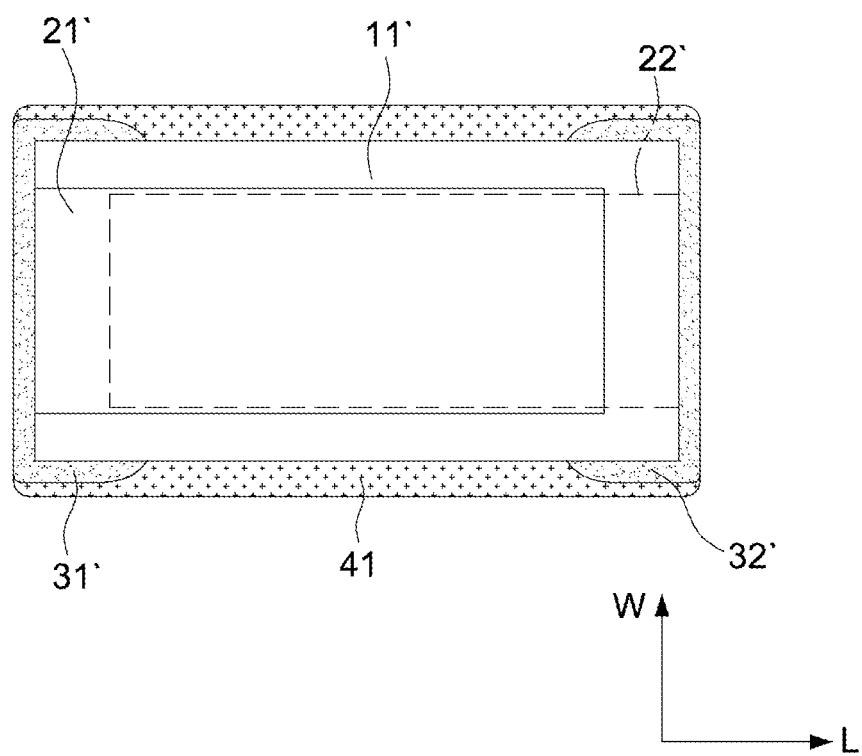
FIG. 6 is a cross-sectional view showing an L-W cross section of the multilayered ceramic electronic component of FIG. 5.

FIG. 6 is an L-W cross-sectional view illustrating the multilayered ceramic capacitor of FIG. 5 cut in a thickness direction.

Referring to FIGS. 5 and 6, in a multilayered ceramic capacitor 1' according to the third embodiment of the present invention, a 'length direction' refers to an 'L' direction of FIG. 5, a 'width direction' refers to a 'W' direction thereof, and a 'thickness direction' refers to a 'T' direction thereof. Here, the 'thickness direction' may be the same as a direction in which the dielectric layers are stacked, that is, a 'stacking direction'.

As shown in FIGS. 5 and 6, a multilayered ceramic electronic component provided according to the third embodiment of the present invention may include: a ceramic body having a hexahedral shape, including a dielectric layer, satisfying T/W>1.0 when a length thereof is L, a width thereof is W, and a thickness thereof is T, and having first and second end surfaces opposing each other in a length direction and first and second side surfaces opposing each other in a width direction; a plurality of first and second internal electrodes disposed in the ceramic body so as to be alternately exposed through the first and second end surfaces, having the dielectric therebetween; first and second external electrodes electrically connected to the first and second internal electrodes, respectively; and insulation layers formed on the first and second side surfaces, wherein the insulation layer covers regions of the first and second external electrodes formed on the first and second side surfaces.

As shown in FIGS. 5 and 6, characteristics of a ceramic body 10' of the multilayered ceramic capacitor according to the third embodiment of the present invention are the same as those of the ceramic body 10 of the multilayered ceramic capacitor according to the first embodiment of the present invention, and therefore, a description of repeated portions will be omitted.

Meanwhile, first and second external electrodes 31' and 32' of the multilayered ceramic capacitor according to the third embodiment of the present invention may be formed on the first and second side surfaces.

In other words, the first and second external electrodes 31' and 32' according to the present embodiment may include the head parts formed on the first and second end surfaces to which the first and second internal electrodes 21' and 22' are exposed and the band parts extended from the head parts to the first and second main surfaces and the first and second side surfaces.

Meanwhile, according to the present embodiment, the external electrode is formed on the side surface of the ceramic body, thereby causing the short-circuit when the multilayer ceramic capacitor topples over at the time of being mounted on the board. Therefore, in order to prevent the short-circuit, the insulation layer 41 formed on the first and second side surfaces so as to cover the external electrodes formed on the first and second side surfaces may be further included in the multilayered ceramic capacitor according to the embodiment of the present invention.

Therefore, in the case in which the first and second external electrodes 31' and 32' are extended to the first and second side surfaces of the ceramic body 10' in the same manner as the related art, even when the multilayered ceramic capacitor topples over in the width direction at the time of being mounted on the board, the short-circuit generated between the multilayered ceramic capacitors adjacent to each other may be prevented and the mounting density may be improved, due to the insulation layer 41 covering regions of the second external electrodes 31' and 32' formed on the first and second side surfaces.

Figure 7:
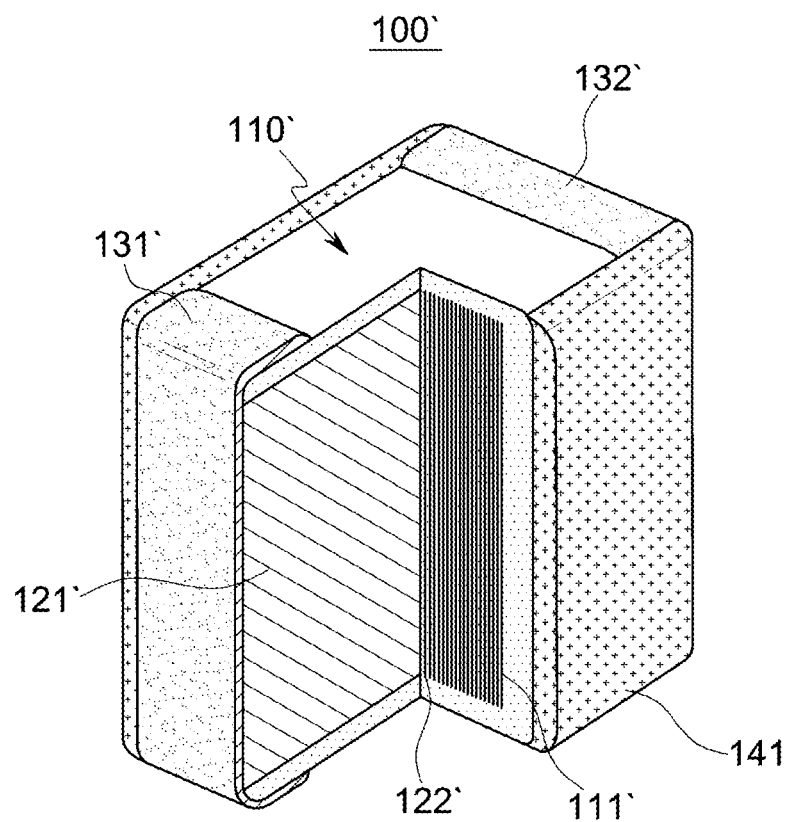
FIG. 7 is a partially cut-away perspective view schematically showing a multilayered ceramic electronic component according to a fourth embodiment of the present invention.
Figure 7:
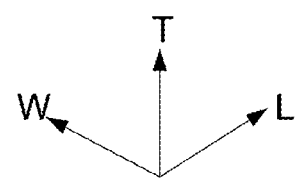

FIG. 7 is a partially cut-away perspective view schematically showing a multilayered ceramic electronic component according to a fourth embodiment of the present invention.

Figure 8:
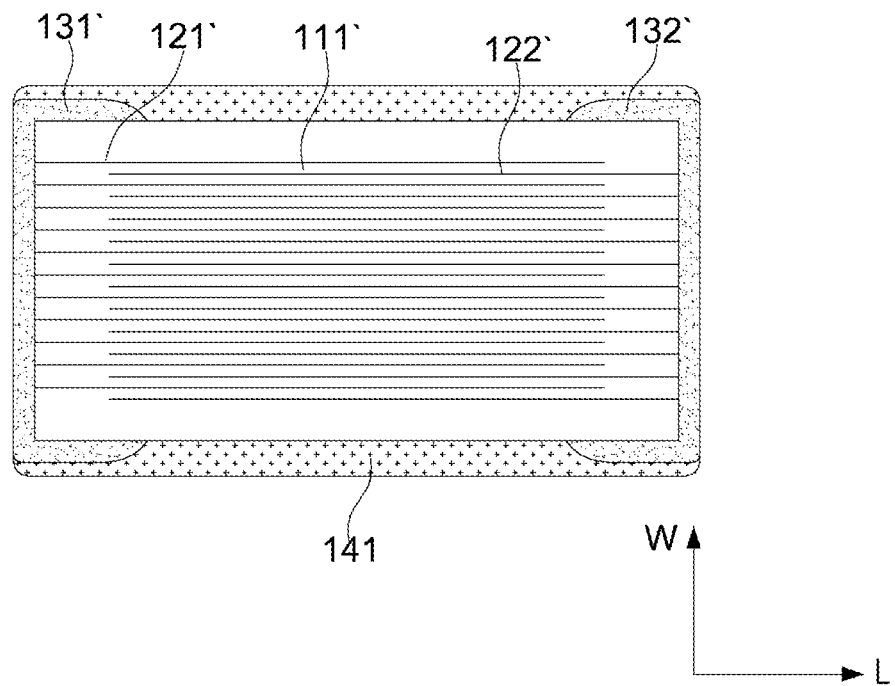
FIG. 8 is a cross-sectional view showing an L-W cross section of the multilayered ceramic electronic component of FIG. 7.

FIG. 8 is an L-W cross-sectional view illustrating the multilayered ceramic capacitor of FIG. 7 cut in a thickness direction.

Referring to FIGS. 7 and 8, in a multilayered ceramic capacitor 100' according to the fourth embodiment of the present invention, a 'length direction' refers to an 'L' direction of FIG. 7, a 'width direction' refers to a 'W' direction thereof, and a 'thickness direction' refers to a 'T' direction thereof. Here, the 'width direction' may be the same as a direction in which the dielectric layers are stacked, that is, a 'stacking direction'.

That is, as shown in FIGS. 7 and 8, in the multilayered ceramic capacitor 100 according to the fourth embodiment of the present invention, the direction in which the dielectric layers are stacked may be the width direction of the ceramic body 110', unlike the above-described multilayered ceramic capacitor according to the third embodiment of the present invention.

When the multilayered ceramic capacitor 100' according to the fourth embodiment of the present invention is mounted on the board to be described below, the multilayered ceramic capacitor 100' may be vertically mounted, such that the internal electrode may be disposed to be perpendicular with respect to the board.

Since other characteristics of the multilayered ceramic capacitor according to the fourth embodiment of the present invention are the same as those of the multilayered ceramic capacitor according to the third embodiment of the present invention, a description of repeated portions will be omitted.

Board for Mounting Multilayered Ceramic Capacitor

Figure 9:
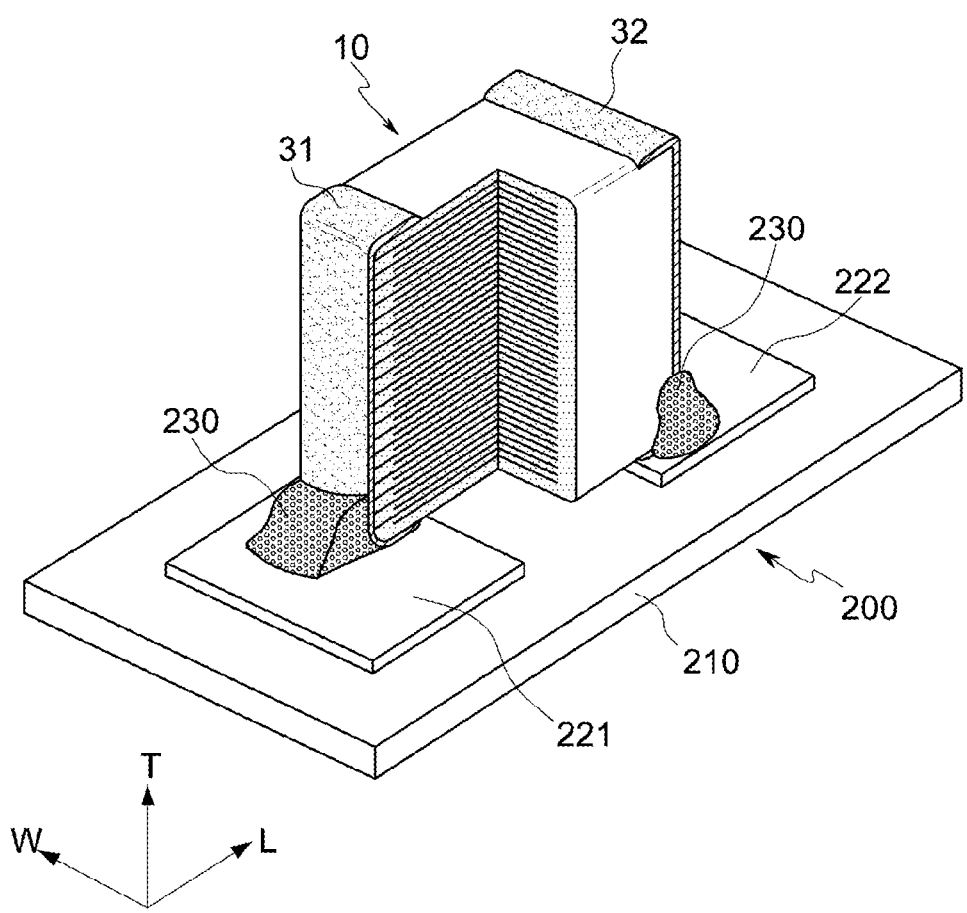
FIG. 9 is a perspective view schematically showing a board for mounting the multilayered ceramic electronic component according to the embodiment of the present invention.

FIG. 9 is a perspective view showing a state in which the multilayered ceramic capacitor of FIG. 1 is mounted on a printed circuit board.

Figure 10:
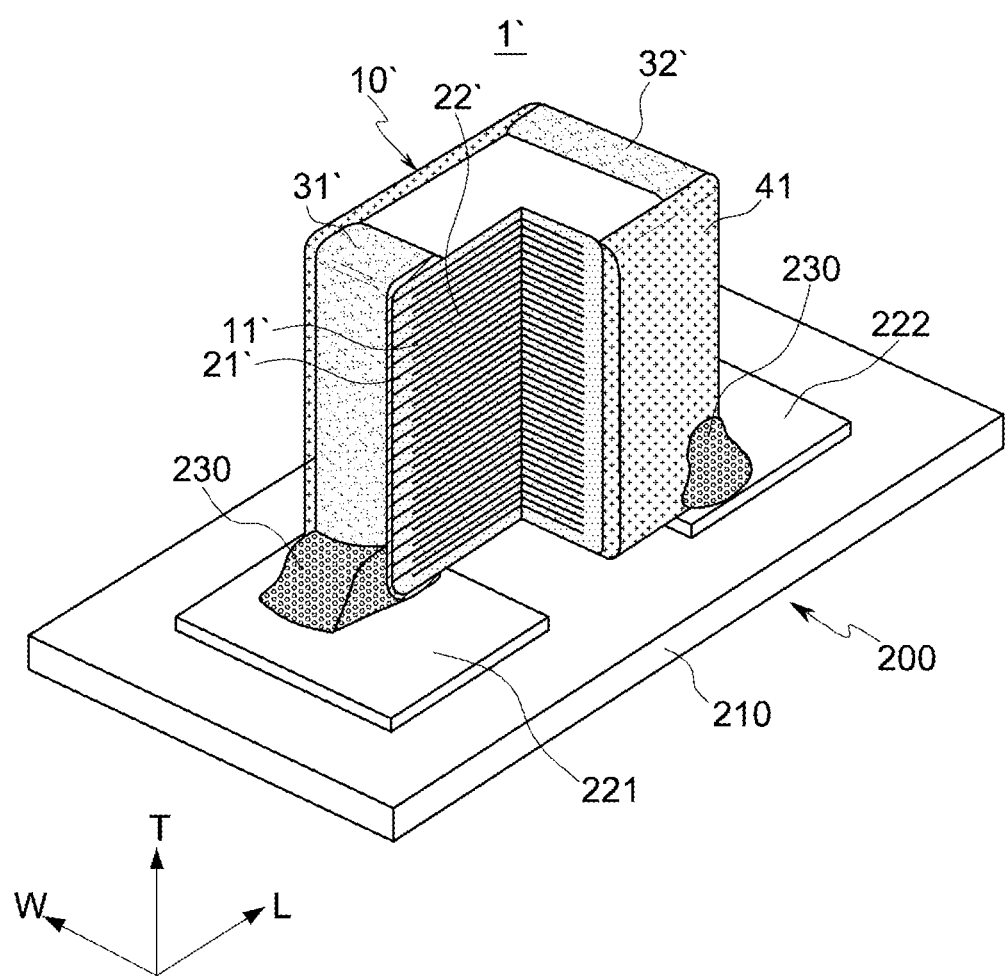
FIG. 10 is a perspective view schematically showing a board for mounting a multilayered ceramic electronic component according to another embodiment of the present invention.

FIG. 10 is a perspective view showing a state in which the multilayered ceramic capacitor of FIG. 5 is mounted on the printed circuit board.

Referring to FIG. 9, a board 200 for mounting the multilayered ceramic capacitor 1 according to the embodiment of the present invention may include a printed circuit board 210 having the multilayered ceramic capacitor 1 mounted thereon, and first and second electrode pads 221 and 222 formed on the printed circuit board 210 so as to be spaced apart from each other.

Here, the multilayered ceramic capacitor 1 may be electrically connected to the printed circuit board 210 by a solder 230 in a state in which the first and second external electrodes 31 and 32 are positioned so as to contact the first and second electrode pads 221 and 222, respectively.

In addition, referring to FIG. 6, the board 200 for mounting the multilayered ceramic capacitor 100 according to another embodiment of the present invention may include a printed circuit board 210 having the multilayered ceramic capacitor 1 mounted thereon, and first and second electrode pads 221 and 222 formed on the printed circuit board 210 so as to be spaced apart from each other.

In the board for mounting the multilayered ceramic electronic component according to another embodiment of the present invention, the external electrodes may not be formed on the side surface of the ceramic body, or even when the external electrodes are formed on the side surfaces of the ceramic body and the multilayered ceramic capacitor topples over in the case that the multilayered ceramic capacitor is mounted on the board, the short-circuit does not occur due to the insulation layer covering the external electrodes formed on the side surfaces.

As a result, the multilayered ceramic capacitor having high capacitance and excellent reliability may be implemented and the mounting density may be improved.

As set forth above, according to the embodiment of the present invention, even when the multilayered ceramic electronic component topples over at the time of being mounted on the board, the multilayered ceramic electronic component capable of preventing the occurrence of short-circuit and the board for mounting the same may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayered ceramic electronic component comprising:
    a ceramic body having a hexahedral shape, including a dielectric layer, satisfying T/W>1.0 when a length thereof is L, a width thereof is W, and a thickness thereof is T, and having first and second main surfaces opposing each other in a thickness direction, first and second end surfaces opposing each other in a length direction, and first and second side surfaces opposing each other in a width direction;
    a plurality of first and second internal electrodes disposed in the ceramic body so as to be alternately exposed through the first and second end surfaces, having the dielectric therebetween; and
    first and second external electrodes electrically connected to the first and second internal electrodes, respectively, wherein the first and second external electrodes are electrically connected to the exposed portions of the first and second internal electrodes, respectively, include first and second head parts formed on the first and second end surfaces, respectively, and first and second band parts formed on the first and second main surfaces, respectively, and are not formed on the first and second side surfaces.

2. The multilayered ceramic electronic component of claim 1, wherein L/W>1.0 is satisfied.

3. The multilayered ceramic electronic component of claim 1, wherein the first and second internal electrodes are stacked in the thickness direction of the ceramic body.

4. The multilayered ceramic electronic component of claim 1, wherein the first and second internal electrodes are stacked in the width direction of the ceramic body.

5. The multilayered ceramic electronic component of claim 1, wherein when an average thickness of the dielectric layer is td, 0.1 μm≤td≤0.6 μm is satisfied.

6. The multilayered ceramic electronic component of claim 1, wherein a thickness of each of the first and second internal electrodes is 0.6 μm or less.

7. The multilayered ceramic electronic component of claim 1, wherein the number of stacked dielectric layers is 500 and more.

8. A multilayered ceramic electronic component comprising:
a ceramic body having a hexahedral shape, including a dielectric layer, satisfying T/W>1.0 when a length thereof is L, a width thereof is W, and a thickness thereof is T, and having first and second end surfaces opposing each other in a length direction and first and second side surfaces opposing each other in a width direction;
a plurality of first and second internal electrodes disposed in the ceramic body to be alternately exposed through the first and second end surfaces, having the dielectric therebetween;
first and second external electrodes electrically connected to the first and second internal electrodes, respectively; and
insulation layers formed on the first and second side surfaces,
wherein the insulation layers cover regions of the first and second external electrodes formed on the first and second side surfaces.

9. The multilayered ceramic electronic component of claim 8, wherein L/W>1.0 is satisfied.

10. The multilayered ceramic electronic component of claim 8, wherein the first and second internal electrodes are stacked in a thickness direction of the ceramic body.

11. The multilayered ceramic electronic component of claim 8, wherein the first and second internal electrodes are stacked in the width direction of the ceramic body.

12. The multilayered ceramic electronic component of claim 8, wherein when an average thickness of the dielectric layer is td, 0.1 μm≤td≤0.6 μm is satisfied.

13. The multilayered ceramic electronic component of claim 8, wherein a thickness of each of the first and second internal electrodes is 0.6 μm or less.

14. The multilayered ceramic electronic component of claim 8, wherein the number of stacked dielectric layers is 500 and more.

15. A board for mounting a multilayered ceramic electronic component, the board comprising:
a printed circuit board having first and second electrode pads disposed thereon; and
a multilayered ceramic electronic component installed on the printed circuit board,
wherein the multilayered ceramic electronic component includes: a ceramic body having a hexahedral shape, including a dielectric layer, satisfying T/W>1.0 when a width thereof is W, and a thickness thereof is T, and having first and second main surfaces opposing each other in a thickness direction, first and second end surfaces opposing each other in a length direction, and first and second side surfaces opposing each other in a width direction; a plurality of first and second internal electrodes disposed in the ceramic body to be alternately exposed through the first and second end surfaces, having the dielectric layer therebetween; and first and second external electrodes electrically connected to the first and second internal electrodes, respectively, and
wherein the first and second external electrodes are electrically connected to the exposed portions of the first and second internal electrodes, respectively, include first and second head parts formed on the first and second end surfaces, respectively, and first and second band parts formed on the first and second main surfaces, respectively, and are not formed on the first and second side surfaces.

16. A board for mounting a multilayered ceramic electronic component, the board comprising:
a printed circuit board having first and second electrode pads disposed thereon; and
a multilayered ceramic electronic component installed on the printed circuit board,
wherein the multilayered ceramic electronic component includes: a ceramic body having a hexahedral shape, including a dielectric layer, satisfying T/W>1.0 when a width thereof is W, and a thickness thereof is T, and having first and second end surfaces opposing each other in a length direction, and first and second side surfaces opposing each other in a width direction; a plurality of first and second internal electrodes disposed in the ceramic body to be alternately exposed through the first and second end surfaces, having the dielectric therebetween; first and second external electrodes electrically connected to the first and second internal electrodes, respectively; and insulation layers formed on the first and second side surfaces, and the insulation layers cover regions of the first and second external electrodes formed on the first and second side surfaces.

* * * * *